United States Patent
Raynor et al.

(10) Patent No.: US 12,182,059 B2
(45) Date of Patent: Dec. 31, 2024

(54) SERIAL BUS SYSTEM AND METHOD

(71) Applicant: STMicroelectronics (Research & Development) Limited, Marlow (GB)

(72) Inventors: Jeffrey M. Raynor, Edinburgh (GB); Sergio Miguez Aparicio, Majadahonda (ES); Benjamin Thomas Sarachi, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 56 days.

(21) Appl. No.: 18/063,453

(22) Filed: Dec. 8, 2022

(65) Prior Publication Data

US 2023/0195680 A1 Jun. 22, 2023

(30) Foreign Application Priority Data

Dec. 16, 2021 (EP) .................................... 21306804
May 20, 2022 (EP) .................................... 22305752

(51) Int. Cl.
*G06F 13/42* (2006.01)
*G06F 13/20* (2006.01)

(52) U.S. Cl.
CPC .......... *G06F 13/4291* (2013.01); *G06F 13/20* (2013.01)

(58) Field of Classification Search
CPC .. G06F 13/4291; G06F 13/20; G06F 13/4077; H03K 19/09429
See application file for complete search history.

(56) References Cited

U.S. PATENT DOCUMENTS

| | | |
|---|---|---|
| 7,606,955 B1 | 10/2009 | Falik et al. |
| 10,670,456 B2 | 6/2020 | Raynor et al. |
| 2004/0059396 A1 | 3/2004 | Reinke et al. |
| 2012/0144078 A1 | 6/2012 | Poulsen |
| 2014/0241414 A1 | 8/2014 | Reidl et al. |
| 2016/0371157 A1* | 12/2016 | Mishra ................ G06F 13/4282 |
| 2018/0329856 A1 | 11/2018 | Mishra et al. |

FOREIGN PATENT DOCUMENTS

| | | |
|---|---|---|
| WO | 2013000916 A1 | 1/2013 |
| WO | 2017070377 A1 | 4/2017 |

OTHER PUBLICATIONS

Mikhaylov, K., et al., "Evaluation of Power Efficiency for Digital Serial Interfaces of Microcontrollers", IEEE 5th International Conference on New Technologies, Mobility and Security (NTMS), May 7-10, 2012, 5 pages.

* cited by examiner

*Primary Examiner* — Glenn A. Auve
(74) *Attorney, Agent, or Firm* — Slater Matsil, LLP (57) ABSTRACT

The present disclosure relates to a secondary device comprising a first port receiving a clock signal from a first port of a primary device and a second port connected to a second port of the primary device. The clock signal determines, for each bit transmission, first, second, third and fourth successive phases. The secondary device puts its second port in a high impedance state during the first, second and fourth phases of each bit transmission. During the third phase of each transmission of a bit of data from the secondary device to the primary device, the secondary device discharges its second port when the transmitted bit has a first value and leaves its second port in a high impedance state when the transmitted bit has a second value.

20 Claims, 3 Drawing Sheets

SERIAL BUS SYSTEM AND METHOD

CROSS-REFERENCE TO RELATED APPLICATIONS

This application is a translation of and claims the priority benefit of European Patent Application No. 21306804, filed on Dec. 16, 2021, entitled "Zero-Power Communication" and European Patent Application No. 22305752, filed on May 20, 2022, entitled "Data exchange on a serial bus," both of which applications are hereby incorporated by reference.

TECHNICAL FIELD

The present disclosure relates generally to electronics circuits and devices, and, more particularly, to a serial bus system and method.

BACKGROUND

It is known to transmit data between two or more electronics devices of a communication system by using conductive wires connecting the devices the ones with each other.

However, known wired links for exchanging data between devices, for example the SPI or I2C buses, suffer from various drawbacks.

SUMMARY

One embodiment provides a secondary device that includes a first port configured to be connected to a first port of a primary device; and a second port configured to be connected to a second port of the primary device. The first port of the secondary device is configured to receive a clock signal determining, for each transmission of a bit between the two devices, a succession of a first phase, a second phase, a third phase and a fourth phase; the secondary device is configured to put its second port in a high impedance state during the first, second and fourth phases of each transmission of a bit between the two devices; and the secondary device is configured, during the third phase of each transmission of a bit of data from the secondary device to the primary device, to discharge its second port to a reference potential when the transmitted bit of data has a first value and to leave its second port in a high impedance state when the transmitted bit of data has a second value.

One embodiment provides a primary device that includes: a first port configured to be connected to a first port of a secondary device; and a second port configured to be connected to a second port of the secondary device. The first port of the primary device is configured to provide a clock signal determining, for each transmission of a bit between the two devices, a succession of a first phase, a second phase, a third phase and a fourth phase; the primary device is configured to load its second port to a first potential different from a reference potential during the first phase of each transmission of a bit of data between the two devices; the primary device is configured to put its second port in a high impedance state during the second and fourth phases of each transmission of a bit of data between the two devices; and the primary device is configured to put its second port in a high impedance state during the third phase of each transmission of a bit of data from the secondary device to the primary device.

One embodiment provides a system comprising the secondary device as described above and the primary device as described above, wherein the first port of the secondary device is connected to the first port of the primary device and the second port of the secondary device is connected to the second port of the primary device.

According to one embodiment, the primary device is configured, during the fourth phase of each transmission of a bit of data from the secondary device to the primary device, to determine a value of the transmitted bit of data based on a potential on its second port during the fourth phase.

According to one embodiment, during the third phase of each transmission of a bit of data from the primary device to the secondary device: the secondary device is configured to put its second port in a high impedance state; and the primary device is configured to apply the reference potential on its second port when the transmitted bit of data has the first value and to put its second port in a high impedance state when the transmitted bit of data has the second value.

According to one embodiment, during the fourth phase of each transmission of a bit of data from the primary device to the secondary device, the secondary device is configured to determine the value of the transmitted bit of data based on a potential on its second port during the fourth phase.

According to one embodiment, the primary device is configured to apply the reference potential to its second port during the first phase of each transmission of a bit of control from the primary device to the secondary device.

According to one embodiment, the secondary device is further configured to leave its second port in a high impedance state during third and fourth phase of each transmission of a bit of control from the primary device to the secondary device, and the primary device is further configured, during the second, third and fourth phases of each transmission of a bit of control from the primary device to the secondary device, to leave its second port in a high impedance state or to discharge its second port to the reference potential.

According to one embodiment, the primary device is configured to load its second port to the first potential during the first phase of each transmission of a bit of acknowledgment from the secondary device to the primary device; and the secondary device is configured, during the third phase of each transmission of a bit of acknowledgment from the secondary device to the primary device, to discharge its second port to the reference potential when the transmitted bit indicates a valid acknowledgment and to leave its second port in a high impedance state when the transmitted bit indicates an invalid acknowledgement.

According to one embodiment, the primary device is configured: to leave its second port at a high impedance state during the second phase, the third phase and the fourth phase of each transmission of a bit of acknowledgment from the secondary device to the primary device; and during the fourth phase of each transmission of a bit of acknowledgment from the secondary device to the primary device, to determine if the acknowledgment is valid based on a potential on its second port during the fourth phase.

According to one embodiment, at the beginning of the first phase, the second phase, the third phase and the fourth phase of each transmission of a bit between the two devices, the primary device is configured to provide an edge of a first type of the clock signal among the rising edge type and the falling edge type.

According to one embodiment, the primary device is configured to provide only one pulse of the clock signal for each transmission of a bit between the two devices, the beginning of the pulse indicating the beginning of the third phase of the transmission and the end of the pulse indicating the beginning of the fourth phase of the transmission.

According to one embodiment, the duration of each pulse of the clock signal is determined by a discharge time of the second ports of the devices from the first potential to the reference potential.

One embodiment provides a method of transmitting a bit between a secondary device and a primary device, the secondary device comprising a first port connected to a first port of the primary device and a second port connected to a second port of the primary device, where: the first port of the primary device provides a clock signal to the first port of the secondary device, the clock signal determining, for each transmission of bit between the two devices, a succession of a first phase, a second phase, a third phase and a fourth phase; during the first phase of each transmission of a bit of data between the two devices, the primary device loads its second port to a first potential different from a reference potential, while the secondary device leaves its second port in a high impedance state; during the second phase of each transmission of a bit of data between the two devices, the primary device and the secondary device leave their second ports in a high impedance state; during the third phase of each transmission of a bit of data from the secondary device to the primary device, while the primary device leaves its second port in a high impedance state, the secondary device discharges its second port to the reference potential to transmit a first value of the bit of data and leaves its second port in a high impedance state to transmit a second value of the bit of data; and during the fourth phase of each transmission of a bit of data between the two devices, a potential on the second ports of the devices determines the value of the transmitted bit of data.

According to one embodiment, the system described above is configured to implement the method above.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "substantially" and "in the order of" signify within 10%, and preferably within 5%.

Various disclosed embodiments may address a need for a communication system comprising two devices exchanging serial data using a wired link, in which the consumption of one of the two devices is reduced compared to known systems of two devices exchanging serial data using a wired link. Accordingly, some embodiments of the present invention may be used to address at least some of the drawbacks of known wired links and/or devices for exchanging serial data.

The inventors here provide a communication system comprising a primary device or circuit M (also referred to as a master device M) and at least one secondary device or circuit S (also referred to as a slave device), which are configured to exchange serial data via a wired bus, for example, a Zero-Power bus or ZP bus. The bus comprises a data wire and a clock wire each connected between the primary device M and the secondary device S. For transmitting a bit of data from the secondary device S to the primary device, the primary device provides a clock signal ZPclk on the clock wire, the signal ZPclk determining or defining four successive phases P1, P2, P3 and P4 for the transmission of the bit of data from the secondary device S to the primary device M. During the first phase P1, the primary device M loads the data wire to a first potential different from a reference potential. During the second phase P2, the data wire is left in a high impedance state by the secondary device S and the primary device M. During the third phase P3, the secondary device S puts the data wire to the reference potential to transmit a first value of the transmitted bit of data, and leaves the data wire in the high impedance state to transmit a second value of the transmitted bit of data. During the fourth phase P4, the potential of the data wire could be read by the primary device M, which then determines the value of the transmitted bit of data based on the read potential.

Thus, in the proposed communicating system, whatever is the value of a bit of data transmitted from the secondary device S to the primary device M, this bit transmission is done without the data wire being load by the secondary device S to the first potential. Thus, the power consumption of the secondary device S is reduced compared to a communication system in which a secondary device would have to load a data wire to the first potential for transmitting a first or second value of a bit of data transmitted from the secondary device to the primary device.

Furthermore, as the signal ZPclk is provided by the primary device M to the secondary device S, the power consumption of the secondary device S is reduced compared to a communicating system in which a clock signal for synchronizing the transmission of a bit would be at least partially provided by the secondary device of the system.

Furthermore, during each transmission of a bit of data, the data wire is loaded by the primary device to the first potential only during the first phase of this transmission of a bit of data, resulting in a lower power consumption compared to a communicating system wherein a data wire would be, by default, pulled up to the first potential, for example thanks to pull-up resistors.

In various embodiments, the protocol disclosed and described in co-pending U.S. patent application Ser. No. 18/063,436 entitled, "Serial Bus Protocol," which is incorporated by reference herein, as well as in European patent application number 22305752, may be used as a data protocol for data transmitted and received using circuits and methods disclosed herein.

Figure 1:
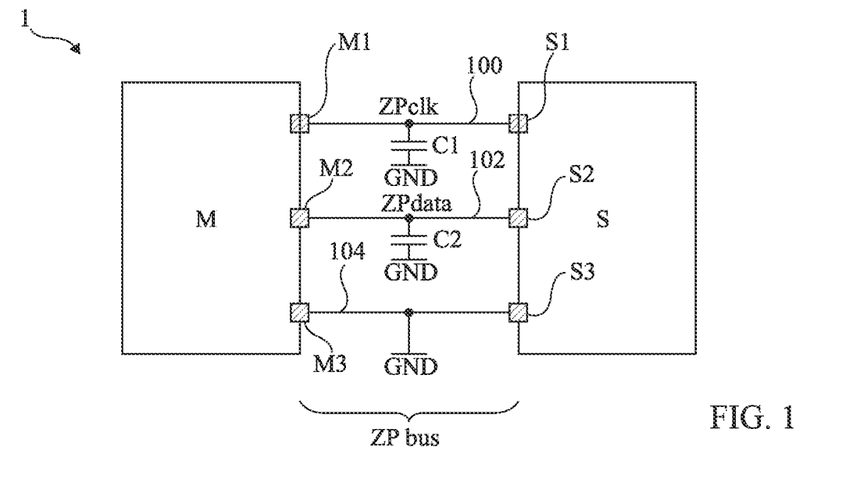
FIG. 1 illustrates with blocks an embodiment of a communication system.

FIG. 1 illustrates with blocks an embodiment of a communication system 1, which comprises a primary device M and at least one secondary device S. In the example of FIG. 1, the system 1 comprises only one secondary device S. The secondary device S comprises a port S1 configured to be connected to a corresponding port M1 of the primary device M. The port S1 is configured to receive a clock signal ZPclk. Thus, the primary device M comprises the port M1 configured to be connected to the corresponding port S1 of the secondary device S. The port M1 is configured to provide the signal ZPclk.

In FIG. 1, port S1 is connected to port M1 by a conductive wire 100, which is also referred to as clock wire 100.

In FIG. 1, a capacitive element C1 is connected between the wire 100 and a reference potential, for example the ground potential GND. This capacitive element C1 represents the capacitance equivalent to the capacitance of the wire 100, the capacitance of port S1 and the capacitance of port M1.

As already indicated above, the signal ZPclk determines, for each transmission of a bit between the devices M and S, four successive phases P1, P2, P3 and P4 of the bit transmission.

According to an embodiment, the transmitted bit is a bit of data, a bit of control or a bit of acknowledgment.

According to an embodiment, the transmitted bit is transmitted from the secondary device S to the primary device M, or from the primary device M to the secondary device S.

For example, the signal ZPclk is a binary signal, that is to say a signal which commutes between two states or levels, and, more particularly, between a first level corresponding to the reference potential, in this example the potential GND, and a second level corresponding to a first potential Vdd different from the reference potential, the potential Vdd being, for example, positive with respect to the reference potential GND. For example, the positive potential Vdd has a value comprised in the range from 0.5 V to 5 V, for example equal to 1.5 V.

Different examples of embodiment of how the signal ZPclk determines the four phase P1, P2, P3 and P4 will be described below, in relation with FIGS. 5, 6 and 7.

The secondary device S comprises a port S2 configured to be connected to a corresponding port M2 of the primary device M. Thus, the primary device M comprises the port M2 configured to be connected to the corresponding port S2 of the secondary device S. In FIG. 1, port S2 is connected to port M2 by a conductive wire 102. The wire 102 is, for example, is also referred to as data wire 102. The signal on the wire 102 is called data signal and is referenced, or referred to as, ZPdata.

In FIG. 1, a capacitive element C2 is connected between the wire 102 and the reference potential GND. This capacitive element C2 represents the capacitance equivalent to the capacitance of the wire 102, the capacitance of port S2 and the capacitance of port M2. For example, the value of capacitive element C2 is determined, or adjusted, by a capacitor (not shown on FIG. 1) of the primary device M, which is connected between port M2 and the reference potential GND and/or by a capacitor (not shown on FIG. 1) of the secondary device S, which is connected between port S2 and the reference potential GND and/or by a capacitor (not shown on FIG. 1) of the system 1, which is connected between the wire 102 and the reference potential GND outside devices S and M.

According to one embodiment, the reference potential GND is provided to a port M3 of the primary device M. The port M3 is configured to receive the potential GND. The secondary device S also comprises a port S3 configured to receive the potential GND. According to one embodiment, ports M3 and S3 are connected to each other by a conductive wire 104, which may also be referred to as a reference wire.

According to one embodiment, the wires 100 and 102, and, when it is present in the system 1, the wire 104, constitute a bus, and, more particularly a bus for transmitting data in series, or serial data. The bus may be a Zero-Power bus or ZP bus.

Although not illustrated, in case system 1 comprises at least two secondary devices S, all the secondary devices S have their ports S1 connected to the same wire 100, and thus to the port M1 of device M, all the secondary devices S have their ports S2 connected to the same wire 102, and thus to the port M2 of device M, and, for example, all their port S3 sharing the same potential GND as the one on port M3 of device M.

The primary device M is configured to put, or leave, its port M2 in a high impedance state during the phases P2 and P4 of each transmission of a bit, for example a bit of data, between the two devices M and S. The primary device M is configured to load its port M2, that is the wire 100, to the potential Vdd during the phase P1 of each transmission of a bit of data between the two devices S and M. The primary device M is configured to put, or leave, its port M2 in a high impedance state during the phase P3 of each transmission of a bit of data from the secondary device S to the primary device M.

Furthermore, the secondary device S is configured to put, or leave, its port S2 in a high impedance state during the phases P1, P2 and P4 of each transmission of a bit, for example a bit of data, between the two devices S a M. The secondary device S is configured, during the phase P3 of each transmission of a bit of data from the secondary device S to the primary device M, to discharge its port S2, that is the wire 102, to the reference potential GND when the transmitted bit of data has a first value, for example 'o', and to leave its port S2 in a high impedance state when the transmitted bit of data has a second value, for example '1'.

Said in other words, for each transmission of a bit of data from the secondary device S to the primary device M: the wire 102 is loaded by the primary device M, and, more particularly, by port M2 of the device M, to the potential Vdd during the phase P1 of the bit transmission, while the port S2 is in a high impedance state; the wire 102 stays at a potential approximatively equal to the potential Vdd during the phase P2 of the bit transmission, because both ports M2 and S2 are in a high impedance state; when the bit to transmit has the first value, the wire 102 is put, or pulled down, at the reference potential GND during the phase P3 by applying potential GND to port S2 while port M2 is in a high impedance state; when the bit to transmit has the second value, the wire 102 stays at a potential approximatively equal to the potential Vdd during the phase P3 of the bit transmission, by leaving both ports S2 and M2, and thus the wire 102, in a high impedance state; and during the phase P4 of the bit transmission, both ports M2 and S2 stay in a high impedance state and the potential on the wire 102 during this phase P4 stays equal to the reference potential if the transmitted bit has the first value, and to approximatively the potential Vdd if the transmitted bit has the second value.

For transmitting a bit at the second value to the primary device M, the secondary device S does not need to load the wire 102, that is the capacitive element C2, to the potential Vdd. This allows to reduce the power consumption of the secondary device S compared to a secondary device in which the transmission of a bit from the secondary device to a primary device would have required the secondary device to load the wire 102 to the potential Vdd.

According to one embodiment, during a transmission of a bit of data from the secondary device S to the primary device M, the value of the transmitted bit is read by the primary device M during the phase P4 of this bit transmission. The reading of the value of the transmitted bit is based on the potential of the wire 102, that is to say the potential on port M2, during the phase P4, for example at the beginning of this phase P4. For example, the primary device M compares the potential of wire 102 (or port M2) to at least one potential (or threshold), and determine if the potential of wire 102 corresponds to the reference potential GND indicating that the transmitted bit has the first value, for example 'o', or if the potential of the wire 102 corresponds to the potential Vdd indicating that the transmitted bit has the second value, for example '1'.

Based on the description above, those skilled in the art are capable of choosing or adapting the capacitance value of the capacitive element C2 and/or the duration of each of the phases P1 to P4 to ensure that, when the transmitted bit of data has the second value (port S2 in high impedance state during the corresponding phase P3), the potential on wire 102 during the corresponding phase P4, for example at the beginning of this phase P4, is approximatively equal to the potential Vdd.

Indeed, in practice, during the phases P2, P3 and P4 of the transmission, from the secondary device S to the primary device M, of a bit of data having the second value, the potential on wire 102 decays with time, at a rate depending on the capacitance value of the capacitive element C2 and possible current leakages through ports S2 and M2.

Thus, in the present disclosure, the potential on wire 102 is said to be "approximatively equal to the potential Vdd", for example, if voltage on wire 102 is superior to a threshold indicating that voltage on wire 102 corresponding to a high level of the signal ZPdata, the voltage on wire 102 corresponding to a low level of the signal ZPdata when that voltage on wire 102 is inferior to the threshold.

For example, the capacitance value of the capacitive element C2 and/or the timing of the signal ZPclk which determines the duration of each of the phases P2, P3 and P4 are determined to ensure that, during the phase P4 of each transmission of a bit of data having the second value, the voltage on the wire 102 is superior to the above-mentioned threshold and is then considered as corresponding to the high level of the signal ZPdata.

According to one embodiment, the system 1, and thus the devices S and M, also allow to transmit a bit of data from the primary device M to the secondary device S. The phases P1, P2 and P4 of the transmission of a bit of data from the primary device M to the secondary device S are identical to those of a transmission of a bit of data from the secondary device S to the primary device M. However, during the phase P3 of the transmission of a bit of data from the primary device M to the secondary device S, the secondary device S is configured to leave its port S2 in a high impedance state and the primary device M is configured to put its port M2, and thus the wire 102, to the reference potential GND if the transmitted bit has the first value, and to leave its port M2, and thus the wire 102, in a high impedance state if the transmitted bit has the second value.

Said in other words, for each transmission of a bit of data from the primary device M to the secondary device S: the wire 102 is loaded by the primary device M, and, more particularly, by port M2 of the device M, to the potential Vdd during the phase P1 of the bit transmission, while the port S2 is in a high impedance state; the wire 102 stays at a potential approximatively equal to the potential Vdd during the phase P2 of the bit transmission, because both ports M2 and S2 are in a high impedance state; when the bit to transmit has the first value, the wire 102 is put, or pulled down, at the reference potential GND during the phase P3 by applying potential GND to port M2 while port S2 is in a high impedance state; when the bit to transmit has the second value, the wire 102 stays at a potential approximatively equal to the potential Vdd during the phase P3 of the bit transmission, by leaving both ports S2 and M2, and thus the wire 102, in a high impedance state; and during the phase P4 of the bit transmission, both ports M2 and S2 stay in a high impedance state and the potential on the wire 102 during this phase P4 stays equal to the reference potential GND if the transmitted bit has the first value, and to approximatively the potential Vdd if the transmitted bit has the second value.

According to one embodiment, during a transmission of a bit of data from the primary device M to the secondary device S, the value of the transmitted bit is read by the secondary device S during the phase P4 of this bit transmission. The reading of the value of the transmitted bit is based on the potential of the wire 102, that is to say the potential on its port S2, during the phase P4, for example at the beginning of this phase P4. For example, the secondary device S compares the potential of wire 102 (or port S2) to at least one potential (or threshold), and determine if the potential of wire 102 corresponds to the reference potential GND indicating that the transmitted bit has the first value, for example 'o', or if the potential of the wire 102 corresponds to the potential Vdd indicating that the transmitted bit has the second value, for example '1'.

According to one embodiment, the system 1, and thus the devices S and M, also allow to transmit a bit of control CTRL from the primary device M to the secondary device S. The primary device M is configured to apply the reference potential GND on its port M2 during the phase P2 of the transmission of the bit CTRL, so that the potential on ports M2 and S2 and on the wire 102 at the end of the phase P2 is equal to the reference potential GND. Thus, the potential of the ports M2 and S2 and of the wire 102 is equal to GND at the beginning of the phase P3 of the transmission of a bit CTRL, whereas it is approximatively equal to Vdd at the beginning of the phase P3 of the transmission of a bit of data between the two devices S and M. This could be detected by the secondary device S, which then determine whether the bit transmitted is a bit of data or a bit CTRL, based on the potential on port S2 at the beginning of phase P3. For example, the secondary device is configured to determine, at the beginning of the phase P3 of a bit transmission, whether the voltage on the wire 102 is approximatively equal to the potential Vdd or is equal to the potential GND, for example by comparing the voltage of wire 102 to at least one threshold, similarly to what has been described above for a transmission of a bit of data.

According to one embodiment, the secondary device S is configured to leave its port S2 at the high impedance state during all of the phases P1 to P4 of each transmission of the bit CTRL from the device M to the device S.

As an example, during the phase P2 of the transmission of the bit CTRL, the primary device M is configured to apply the reference potential GND on the port M2. As another example, during the phase P2 of the transmission of the bit CTRL, the primary device M is configured to leave the port M2 in a high impedance state, resulting in wire 102 staying at the reference potential GND as port S2 is also in the high impedance state.

As an example, during the phase P4 of the transmission of the bit CTRL, the primary device M is configured to apply the reference potential GND on the port M2. As another example, during the phase P4 of the transmission of the bit CTRL, the primary device M is configured to leave the port M2 in a high impedance state, resulting in wire 102 staying at the reference potential GND as port S2 is also in the high impedance state.

Said in other words, for each transmission of a bit CTRL from the primary device M to the secondary device S: the wire 102 is put, or pulled down, at the reference potential GND during the phase P1 of the transmission of the bit CTRL because port M2 is put to potential GND while port S2 is in a high impedance state; and the wire 102 stays at the reference potential GND during the other phases P2, P3 and P4 of this transmission.

According to one embodiment, the secondary device S is further configured to transmit a bit of acknowledgment ACK to the primary device M. The bit ACK has the first value for indicating a valid acknowledgment, or, said in other words, that the acknowledgment is granted, and has the second value for indicating an invalid acknowledgement, or, said in other words, that the acknowledgment is refused. The transmission of a bit ACK from the secondary device S to the primary device M when the bit ACK has the first value, respectively the second value, is identical to the transmission of a bit of data from the secondary device S to the primary device M when the data bit has the first value, respectively the second value. Said in other words, the acknowledgment is granted if the wire 102 and ports M2 and S2 are pulled down to the reference potential GND during phase P3, so that granting an acknowledgment requires an action from the secondary device S. Thus, in case the secondary device S just leaves its port S2 to a high impedance state, the acknowledgment is denied.

According to one embodiment, the primary device M is further configured to transmit a bit of acknowledgment ACK to the secondary device S. The bit ACK has the first value for indicating a valid acknowledgment and has the second value for indicating an invalid acknowledgement. The transmission of a bit ACK from the primary device M to the secondary device S when the bit ACK has the first value, respectively the second value, is identical to the transmission of a bit of data from the primary device M to the secondary device S when the data bit has the first value, respectively the second value. Said in other words, the acknowledgment is granted if the wire 102 and ports M2 and S2 are pulled down to the reference potential GND during phase P3, so that granting an acknowledgment requires an action from the primary device M. Thus, in case the primary device M just leaves its port S2 to a high impedance state, the acknowledgment is denied.

In the system 1, there is no pull-up resistor coupling the wire 102 to a node at a potential, for example Vdd, corresponding to a high level of the signal on the wire 102. Said in other words, system 1 does not comprise any no pull-up resistor having a first terminal connected to a node at a potential, for example Vdd, corresponding to a high level of the signal on the wire 102, and a second terminal connected to the wire 102. The same applies for the wire 100.

Figure 2:
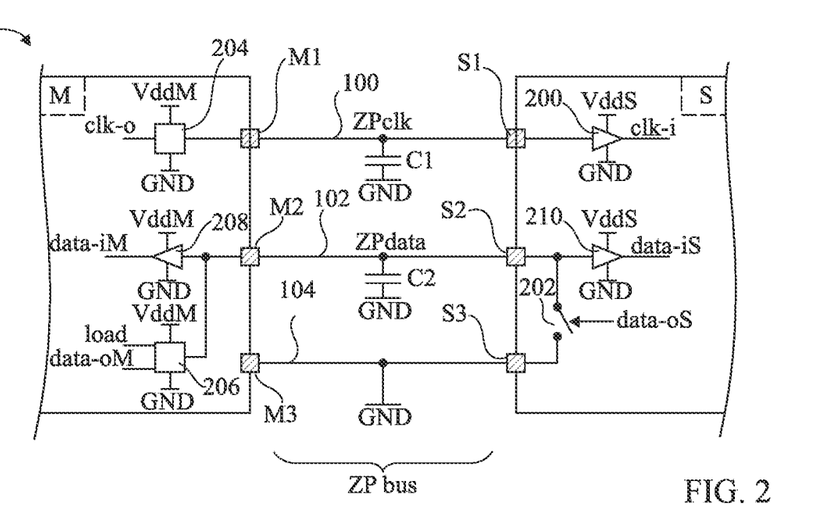
FIG. 2 is a schematic illustrating a detailed embodiment of the system of FIG. 1.

FIG. 2 is a schematic illustrating an example of a detailed embodiment of the communication system 1 of FIG. 1. Only the differences between FIGS. 1 and 2 are discussed here. Furthermore, the detailed embodiment shows in FIG. 2 is just an example of implementation, and those skilled in the art are capable of implementing device S and/or device M differently.

In the example illustrated by FIG. 2, the secondary device S comprises a circuit 200. The circuit 200 is configured to generate a clock signal clk-i for the secondary device S, the signal clk-i being an internal clock signal of the secondary device S. The circuit 200 has an input connected to the port S1 in order to receive the signal ZPclk. An output of the circuit 200 provides the signal clk-i. The circuit 200 is, for example, configured so that each commutation of the signal ZPclk leads to a corresponding commutation of the signal clk-i. As an example, the circuit 200 is a buffer circuit. The circuit 200 is, for example, powered by a supply potential VddS of the secondary device S. To be powered, the circuit 200 is, for example, configured to receive the potentials VddS and GND. For example, the potential VddS is equal or substantially equal to the potential Vdd.

In the example illustrated by FIG. 2, the secondary device S comprises a circuit 202. Circuit 202 is configured to transmit a bit of data from the secondary device S to the primary device M. Said in other words, the circuit 202 is configured, during the phase P4 of a transmission of a bit from the device S to the device M, to put the port S2 to the potential GND, respectively to leave the port S2 in a high impedance state, when the transmitted bit has the first value, respectively the second value. Furthermore, the circuit 202 is configured to leave the port S2 in a high impedance state during the phases P1, P2 and P4 of a transmission of a bit between the devices S and M. The circuit 202 is connected to port S2. As an example, the circuit 202 receives a signal data-oS indicating, for each transmission of a bit from the secondary device S to the primary device M, the value of the transmitted bit. More generally, for each transmission of a bit between the devices S and M, the signal data-oS indicates to circuit 202, when port S2 has to be put in a high impedance state or when potential GND has to applied to port S2. The circuit 202 is, for example, a switch connected between the port S2 and the potential GND, that is, for example, the port S3. The switch 202 is controlled by the signal data-oS. For example, switch 202 is a MOS ("Metal-Oxide-Semiconductor") transistor. The port S2 is in a high impedance state when the switch 202 is open, and is at the reference potential GND when the switch 202 is closed. For example, transistor 202 has a canal of the N type (NMOS transistor) having its drain connected to port S2, its source connected to port S3, and its gate receiving the signal data-oS.

As an example, the secondary device S comprises a control circuit (not shown on FIG. 2) configured to control each transmission of a bit between the devices S and M. For example, the control circuit receives the signal clk-i and provides the signal data-o. For example, the control circuit generates the signal data-o based at least on signal clk-i. For example, the control circuit generates the signal data-o based at least on signal clk-i and on the fact that the bit is transmitted from the secondary device S to the primary device M or from the primary device M to the secondary device and on the value of the transmitted bit when the bit is transmitted toward the primary device M.

In the example illustrated by FIG. 2, the primary device M comprises a circuit 204 configured to provide the signal ZPclk on the port M1, so that signal ZPclk is transmitted to the port S1 via the clock wire 100. The circuit 204 is, for example, configured to generate signal ZPclk from a signal clk-o, signal clk-o being an internal signal of the device M. The circuit 204 has an input receiving the signal clk-o and an output connected to the port M1 in order to provide the signal ZPclk. For example, the circuit 204 is configured so that each commutation of the signal clk-o leads to a corresponding commutation of the signal ZPclk. As an example, the circuit 204 is a buffer circuit. The circuit 204 is, for example, powered by a supply potential VddM of the primary device M. To be powered, the circuit 204 is, for example, configured to receive the potentials VddM and GND.

The potential VddM is, for example, equal or substantially equal to the potential Vdd. For example, potential VddM is inferior to the sum of the potential Vdd and a triggering threshold VtrigS of an overvoltage protection component of the secondary device S, but is superior to a threshold of the secondary device S with which the potential on wire 102 is compared to determine whether the signal ZPdata is in a high or low level. For example, in a symmetrical manner, potential VddM is inferior to the sum of the potential Vdd and a triggering threshold VtrigM of an overvoltage protection component of the primary device M, but is superior to a threshold of the primary device M with which the potential on wire 102 is compared to determine whether the signal ZPdata is in a high or low level. As an example, thresholds VtrigM and VtrigS are both equal, for example to 0.7 V, and voltage VddM and VddS each has a value in the range from Vdd−VtrigM to Vdd+VtrigM.

In the example of FIG. 2, the primary device M comprises a circuit 206 configured, for each transmission of a bit of data between the devices S and M, to load the port M2, and so the wire 102, to the potential Vdd during the phase P1 of this data bit transmission. Furthermore, the circuit 206 is configured, for each transmission of a bit of data from the secondary device S to the primary device M, to leave its port M2 in a high impedance state during the phases P2, P3 and P4 of this data bit transmission toward the primary device M. The circuit 206 has an output connected to port M2. For example, a signal load indicates whether the circuit 206 has to apply the potential Vdd on port M2 or to leave the port M2 in a high impedance state. The circuit 206 is, for example, powered by the supply potential VddM. The circuit 200 to be powered is, for example, configured to receive the potentials VddM and GND.

As an example, the circuit M comprises a control circuit (not shown on FIG. 2) configured to control each transmission of a bit between the devices S and M. For example, the control circuit generates the signals load and clk-o.

In the example illustrated by FIG. 2, the primary device M comprises a circuit 208 configured to determine the value of a bit of data transmitted from the secondary device S to the primary device M, during the phase P4 of this data bit transmission. The circuit 208 has an input connected to the port M2. The circuit 208 is, for example, configured to generate, based on the signal ZPdata, a signal data-iM, for example a binary signal, representative of the value the bit of data transmitted from the secondary device S to the primary device M. More generally, the signal data-iM indicates if the potential of signal ZPdata corresponds to potential Vdd or to potential GND. Said in other words, the circuit 208 is configured to generate the signal data-iM from the potential on the port M2 during the phase P4, preferably at the beginning of this phase P4, of each transmission of a bit of data from the secondary device S to the primary device M. For example, the circuit 208 is configured to compare the potential of the port M2 (or, said in other word, the level of the signal ZPdata) to at least one level of potential, and to determine whether the level of signal ZPdata corresponds to the potential Vdd or to the potential GND. For example, circuit 208 comprises at least one comparator. For example, a comparator of circuit 208 may be an analog comparator comprising an operational amplifier. For example, a comparator of circuit 208 may be a digital gate, such as a flip-flop or an inverter, in which the threshold is usually equal to half the value of the supply potential of the gate, this supply potential being, for example, equal to VddM in the primary device M. The circuit 208 is, for example, powered by the supply potential VddM. To be powered, the circuit 200 is, for example, configured to receive the potentials VddM and GND.

According to an embodiment the system 1, and thus the devices S and M, are also configured to transmit a bit of data from the primary device M to the secondary device S. Thus, during the phase P3 of this bit transmission, the circuit 202 of device S is, for example, further configured to leave the port S2 in a high impedance state, and the circuit 206 of the device M is, for example, configured to apply the reference potential GND on the port M2 and wire 102, respectively to leave the port M2 in a high state impedance, when the transmitted bit has the first value, respectively the second value. For example, the circuit 206 receives a signal data-oM indicating whether, during the phase P3 of the transmission of bit of data, the circuit 206 has to leave port P2 in a high impedance state or to apply potential GND on port P2. For example, signal data-oM is provided by the control circuit (not shown on FIG. 2) of the device M.

In an embodiment where the system 1 is also configured to transmit a bit of data from the primary device M to the secondary device S, the secondary device S is, for example, configured to determine the value of the transmitted bit based on the potential of the port S2 and the wire 102 during the phase P4 of the transmission, for example at the beginning of this phase P4. Thus, according to one embodiment, the secondary device S comprises a circuit 210 configured to generate, based on the signal ZPdata, a signal data-iS, for example a binary signal, representative of the value the bit of data transmitted from the primary device M to the secondary device S. More generally, the signal data-iS indicates if the potential of signal ZPdata corresponds to potential Vdd or to potential GND. Said in other words, the circuit 210 is configured to determine the value of the transmitted bit from the potential on the port S2 during the phase P4 of this data bit transmission, preferably at the beginning of this phase P4. The circuit 210 has an input connected to port S2. For example, the circuit 210 is configured to compare the potential of the port S2, or, said in other word, the level of the signal ZPdata, to at least one level of potential, and to determine whether the level of signal ZPdata corresponds to the potential Vdd or to the potential GND. For example, circuit 210 comprises at least one comparator. For example, a comparator of circuit 210 may be an analog comparator comprising an operational amplifier. For example, a comparator of circuit 210 may be a digital gate, such as a flip-flop or an inverter, in which the threshold is usually equal to half the value of the supply potential of the gate, this supply potential being, for example, equal to VddS in the secondary device S. For example, the circuit 210 is powered by the supply potential VddS. For example, to be powered, the circuit 200 is configured to receive the potentials VddS and GND. For example, circuit 210 is similar or identical to circuit 208. Signal data-iS is for example provided to the control circuit (not shown on FIG. 2) of the device S.

According to one embodiment, the system 1, and thus the devices S and M, are also configured to transmit a bit of control CTRL from the primary device M to the secondary device S. The circuit 206 is then, for example, configured to apply the reference potential GND to the port M2 and the wire 102 during the phase P1 of the transmission of the bit CTRL from the device M to the device S. The circuit 206 is, for example, further configured to leave the port M2 in a high impedance state or to apply the potential GND on port M2 during each of the phases P2, P3 and P4 of this transmission of the bit CTRL. During the transmission of the bit CTRL, the circuit 206, for example, determines, for each phase P1, P2, P3, P4 of the transmission, if the port M2 has to be left in a high impedance state or if the reference potential GND has to be applied to the port M2 based at least on signal load, for example based on signals load and data-oM. Furthermore, the circuit 210 is, for example, configured to read, or determine, whether the potential on the port S2 is equal to the reference potential GND at the beginning of the phase P3. For example, the signal data-iS indicates whether the port S2 is at the potential GND at the beginning of the phase P3. The circuit 202 is, for example, configured, or controlled by the signal data-oS, to leave the port S2 in a high impedance state during all of the phase P1, P2, P3 and P4 of the transmission of a bit CTRL from the device M to the device S.

According to one embodiment, the secondary device S is further configured to transmit a bit of acknowledgment ACK to the primary device M. The circuits 202, 206 and 208 are then, for example, configured to implement this transmission in a manner identical to that of the transmission of a bit of data from the secondary device S to the primary device M. In particular, to grant the acknowledgment, the circuit 202 is configured to apply, during phase P3 of the bit transmission, the reference potential GND on port S2 while port M2 is left in a high impedance state by the primary device M.

According to one embodiment, the primary device M is further configured to transmit a bit of acknowledgment ACK to the secondary device M. The circuits 202, 206 and 210 are then, for example, configured to implement this transmission in a manner identical to that of the transmission of a bit of data from the primary device M to the secondary device S. In particular, to grant the acknowledgment, the circuit 206 is configured to apply, during phase P3 of the bit transmission, the reference potential GND on port M2 while port S2 is left in a high impedance state by the secondary device S.

Figure 3:
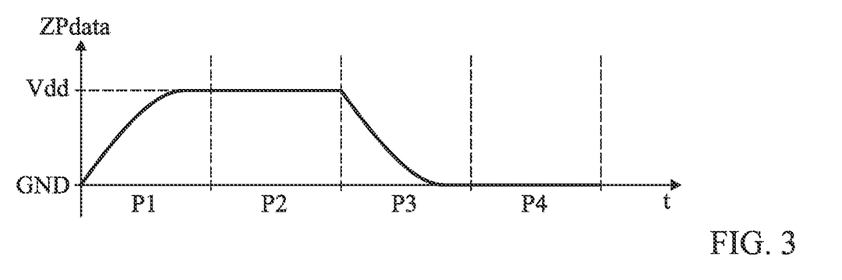
FIG. 3 is a chronogram illustrating an embodiment of a transmission of a bit of data having a first value in the system of FIG. 1 or 2.

FIG. 3 is a chronogram illustrating an embodiment of a transmission of a bit of data having a first value in the communication system of FIG. 1 or 2. More particularly, FIG. 3 shows the evolution of the signal ZPdata on the wire 102 during the successive phases P1, P2, P3 and P4 of the transmission of a bit of data from the secondary device S to the primary device M, in the case where the transmitted bit has the first value.

During the phase P1, the primary device M loads the wire 102 to potential Vdd by applying potential Vdd on port M2 while port S2 is in a high impedance state. As illustrated by dotted lines in FIG. 3, at the beginning of the phase P1, the potential of the wire 102 may already be approximatively equal to potential Vdd because of the phase P2 of a previous transmission, between the devices S and M, of a bit of data having the first value or of a bit ACK indicating an invalid acknowledgment.

During the next phase P2, the wire 102 is left in a high state impedance as both ports S2 and M2 are in a high impedance state. Thus, potential of the wire 102 stays approximatively equal to the potential Vdd. Although not shown on FIG. 3, during the phase P2, the potential of the wire 102 may slightly decrease because of some current leaks.

For example, at the beginning of the phase P3, the secondary device S detects that the potential of the wire 102 corresponds to the potential Vdd, meaning that the transmitted bit is not a bit CTRL.

During the next phase P3, as the transmitted bit has the first value, the potential GND is applied to port S2 and wire 102 by the secondary device S, while the port M2 is left in a high impedance state by the primary device M. Thus, the wire 102 is discharged to the potential GND.

During the next phase P4, the potential of the wire 102 stays equal to the potential GND as both ports S2 and M2 are in a high impedance state, indicating to the primary device M that the bit received from the secondary device S has the first value. For example, the primary device M detects that the transmitted bit has the first value based on the state of signal data-iM during the phase P4, for example based on the state of signal data-IM at the beginning of the phase P4.

Although not shown on FIG. 3, the illustrated phase P1 may immediately follow a phase P4 of a previous transmission of a bit between the devices S and M and/or the illustrated phase P4 may be immediately followed by the phase P1 of a next transmission of a bit between the devices S and M.

Although the FIG. 3 illustrates the transmission of a bit of data from the secondary device S to the primary device M in the case where the transmitted bit has the first value, FIG. 3 may also illustrate the transmission of a bit of data from the primary device M to the secondary device S in the case where the transmitted bit has the first value. Indeed, in phase P3 of the transmission of a bit of data having the first value from the primary device M to the secondary device S, the potential GND is applied to port M2 and wire 102 by the primary device M, while the port S2 is in a high impedance state, and the wire 102 is discharged to the potential GND. Thus, in phase P3 of such a bit transmission, the wire 102 is discharged to reference potential GND as illustrated on FIG. 3.

Figure 4:
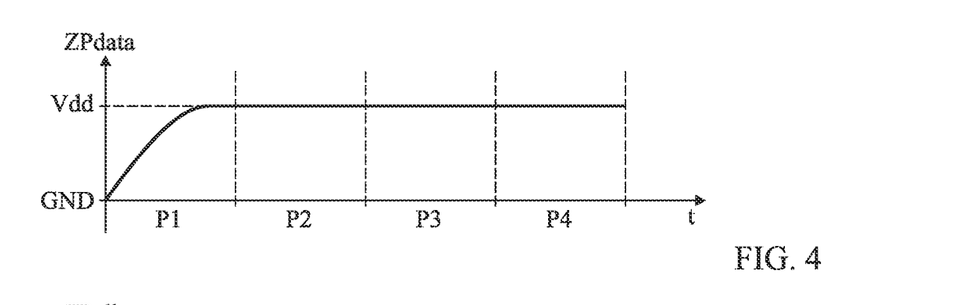
FIG. 4 is a chronogram illustrating an embodiment of a transmission of a bit of data having a second value in the system of FIG. 1 or 2.

FIG. 4 is a chronogram illustrating an embodiment of a transmission of a bit of data having a second value in the communication system of FIG. 1 or 2. More particularly, FIG. 4 shows the evolution of the signal ZPdata on the wire 102 during the successive phases P1, P2, P3 and P4 of the transmission of a bit of data from the secondary device S to the primary device M, in the case where the transmitted bit has the second value.

Only the differences between FIGS. 3 and 4 are here discussed. In particular, FIG. 4 differs from FIG. 3 only by its phases P3 and P4.

During phase P3 of FIG. 4, as the transmitted bit has the second value, the port S2 is left in a high impedance state by device S. Thus, the potential of the wire 102 stays approximatively equal to the potential Vdd as both ports S2 and M2 are in a high impedance state. Although not shown on FIG. 4, during this phase P3, the potential of the wire 102 may slightly decrease because of some current leaks.

During the next phase P4 of FIG. 4, the potential of the wire 102 stays approximatively equal to the potential Vdd as both ports S2 and M2 are in a high impedance state, indicating to the primary device M that the bit received from the secondary device S has the second value. For example, the primary device M detects that the transmitted bit has the second value based on the state of signal data-iM during the phase P4, for example based on the state of signal data-iM at the beginning of the phase P4.

Although not shown on FIG. 4, during phases P3 and P4, the potential of the wire 102 may slightly decrease because of some current leaks.

Although not shown on FIG. 4, the illustrated phase P1 may immediately follow a step P4 of a previous transmission of a bit between the devices S and M and/or the illustrated phase P4 may be immediately followed by the phase P1 of a next transmission of a bit between the devices S and M.

Although the FIG. 4 illustrates the transmission of a bit of data from the secondary device S to the primary device M in the case where the transmitted bit has the second value, FIG. 4 may also illustrate the transmission of a bit of data from the primary device M to the secondary device S in the case where the transmitted bit has the second value. Indeed, in phase P3 of the transmission of a bit of data having the second value from the primary device M to the secondary device S, the port M2 is left in a high impedance state by the primary device M, while the port S2 is in a high impedance state, and the wire 102 stays at a potential approximatively equal to Vdd. Thus, in phase P3 of such a bit transmission, the wire 102 stays at the potential Vdd as illustrated on FIG. 4.

As previously indicated in relation with FIGS. 1 and 2, the signal ZPclk determines, for each transmission of a bit between the devices S and M, the successive phases P1, P2, P3 and P4, or, said in other word, the succession of the phases P1, P2, P3 and P4. Said in yet other words, the signal ZPclk determines, for each transmission of a bit between the devices S and M, a synchronization of the transmission between the devices S and M.

Figure 5:
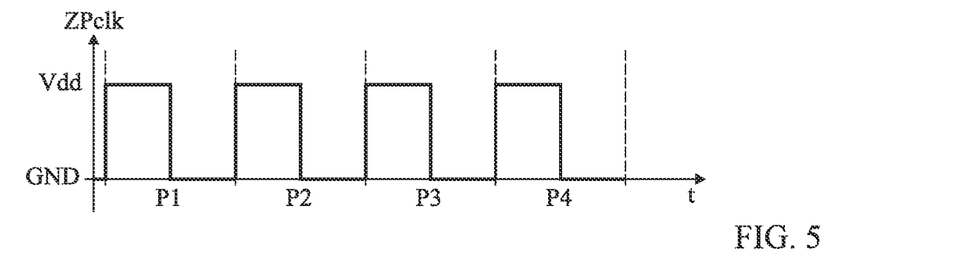
FIG. 5 is a chronogram illustrating a synchronization of a bit transmission in the system of FIG. 1 or 2 according to an embodiment.
Figure 6:
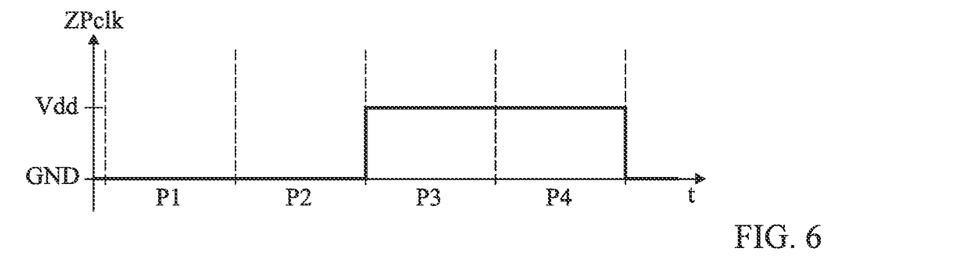
FIG. 6 is a chronogram illustrating a synchronization of a bit transmission in the system of FIG. 1 or 2 according to another embodiment.
Figure 7:
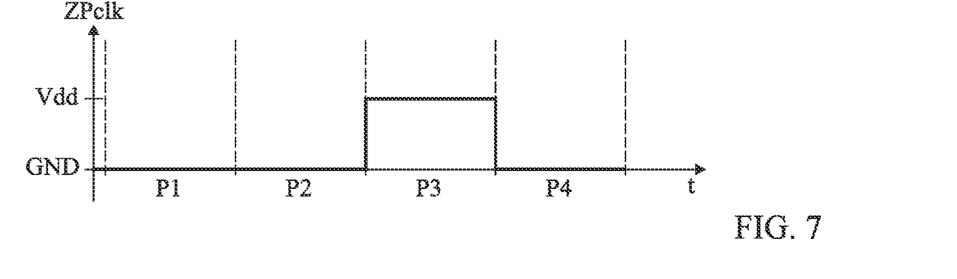
FIG. 7 is a chronogram illustrating a synchronization of a bit transmission in the system of FIG. 1 or 2 according to yet a further embodiment.

FIGS. 5, 6 and 7 each corresponds to a chronogram illustrating such a synchronization according to respective different embodiments. More particularly, FIGS. 5, 6 and 7 each shows the evolution of the signal ZPclk on the wire 100 and the corresponding succession of the phases P1, P2, P3 and P4.

In the embodiment of FIG. 5, each phase P1, P2, P3 and P4 corresponds to a respective cycle, or period, of the signal ZPclk. Thus, in FIG. 5, a bit transmission takes four periods of the signal ZPclk. In the example of FIG. 5, each period of the signal ZPclk begins by an active edge of the signal ZPclk, to know a rising edge in the example of FIG. 5. Thus, each phase P1, P2, P3, P4 of the transmission begins in synchronization with an active edge of the signal ZPclk.

In the embodiments of FIGS. 6 and 7, each transmission of a bit between devices S and M is performed in only one cycle or period of the signal ZPclk. Said in other words, in these embodiments, each transmission of a bit corresponds to only one pulse of the signal ZPclk.

More particularly, in FIGS. 6 and 7, the beginning of the phase P3 of the bit transmission, or, said in other words, the switching from the phase P2 to the phase P3 of this transmission, corresponds to the beginning of the pulse of the signal ZPclk. The beginning of the pulse of the signal ZPclk correspond to an active edge of the signal ZPclk, to know a rising edge in the examples of FIGS. 6 and 7.

In the embodiment of FIG. 6, the end of the phase P4 of the bit transmission corresponds to the end of the pulse of the signal ZPclk. The end of the pulse of the signal ZPclk corresponds to an inactive edge of the signal ZPclk, to know a falling edge in the example of FIG. 6. For example, in such an embodiment, the value of the potential of the signal ZPdata is read at the end of the phase P4.

In the embodiment of FIG. 7, the end of the phase P3 of the bit transmission, or, said in other words, the switching from the phase P3 to the phase P4 of this transmission, corresponds to the end of the pulse of the signal ZPclk. The end of the pulse of the signal ZPclk corresponds to an inactive edge of the signal ZPclk, to know a falling edge in the example of FIG. 7. For example, in such an embodiment, the value of the potential of the signal ZPdata is read at the beginning of the phase P4.

According to one embodiment, in the case of FIG. 7, the duration of the pulse of the signal ZPclk, or, said in other words, the duration of the phase P3, is determined by the time required by the secondary device S to discharge the wire 102 from the potential Vdd to the potential GND. More particularly, the duration of the pulse ZPclk is determined by the discharging time of the wire 102 by the device S, so that the device S is capable of fully discharging the wire 102 during the phase P3. For example, the duration of the pulse ZPclk is equal to the time required by the secondary device S to discharge the wire 102 to the potential GND, for example incremented by a margin.

In one embodiment where the primary device M could transmit bits of data toward the secondary device S, the duration of the pulse of the signal ZPclk may be further based on the time required by the primary device M to discharge the wire 102 from the potential Vdd to the potential GND, so that the device M is capable of fully discharging the wire 102 during the phase P3.

As the embodiments of FIGS. 6 and 7 require less pulses of the signal ZPclk to implement a transmission of a bit between the devices S and M than the embodiment of FIG. 5, the power consumption of the system 1, and in particular of the primary device M, is less in the embodiments of FIGS. 6 and 7 than in the embodiment of FIG. 5.

Figure 8:
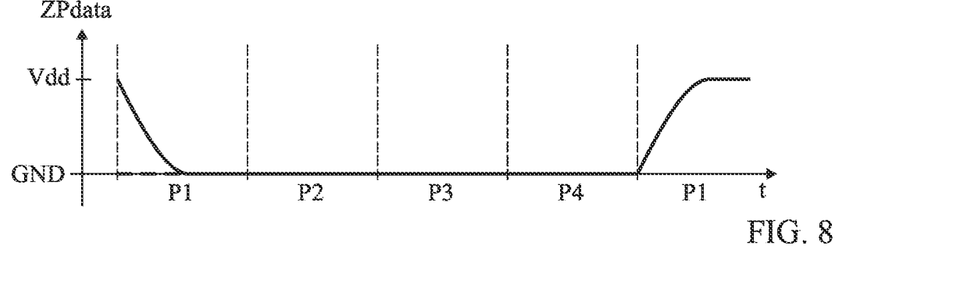
FIG. 8 is a chronogram illustrating an embodiment of a transmission of a bit of control in the system of FIG. 1 or 2.

FIG. 8 is a chronogram illustrating an embodiment of a transmission of a bit of control in the system of FIG. 1 or 2. More particularly, FIG. 8 shows the evolution of the signal ZPdata on the wire 102 during the successive phases P1, P2, P3 and P4 of the transmission of a bit of control CTRL from the primary device M to the secondary device S.

During the phase P1, the primary device M applies the reference potential to its port M2 while port S2 is in a high impedance state, to discharge the wire 102 to potential GND.

As illustrated by dotted lines in FIG. 8, at the beginning of the phase P1, the potential of the wire 102 may already be the reference potential GND.

During the next phase P2, potential GND is applied to the port M2 or the port M2 is left in high impedance state, and the wire 102 is left in a high state impedance as port S2 is in a high impedance state. Thus, potential of the wire 102 stays equal to the reference potential GND.

For example, at the beginning of the phase P3, the secondary device S detects that the potential of the wire 102 corresponds to the potential GND, meaning that the transmitted bit is the bit CTRL. For example, the secondary device S detects the control bit CTRL based on the state of signal data-iM at the beginning of the phase P3.

During the next phase P3, potential GND is applied to the port M2 or the port M2 is left in high impedance state, and the wire 102 is left in a high state impedance as port S2 is in a high impedance state. Thus, potential of the wire 102 stays equal to the reference potential GND.

During the next phase P4, potential GND is applied to the port M2 or the port M2 is left in high impedance state, and the wire 102 is left in a high state impedance as port S2 is in a high impedance state. Thus, potential of the wire 102 stays equal to the reference potential GND.

Although not shown on FIG. 3, the illustrated phase P1 may immediately follow a phase P4 of a previous transmission of a bit between the devices S and M and/or the illustrated phase P4 may be immediately followed by the phase P1 of a next transmission of a bit between the devices S and M.

Figure 9:
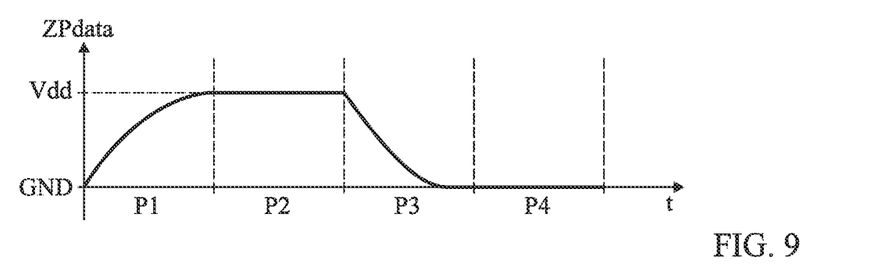
FIG. 9 is a chronogram illustrating an embodiment of a transmission of a bit of acknowledgment in the system of FIG. 1 or 2.

FIG. 9 is a chronogram illustrating an embodiment of a transmission of a bit of acknowledgment in the system of FIG. 1 or 2. More particularly, FIG. 9 shows the evolution of the signal ZPdata on the wire 102 during the successive phases P1, P2, P3 and P4 of the transmission of a bit of acknowledgment from the secondary device S to the primary device M, in the case where the acknowledgment is granted.

During the phase P1, the primary device M loads the wire 102 to potential Vdd by applying potential Vdd on port M2 while port S2 is in a high impedance state. As illustrated by dotted lines in FIG. 3, at the beginning of the phase P1, the potential of the wire 102 may already be approximatively equal to potential Vdd.

During the next phase P2, the wire 102 is left in a high state impedance as both ports S2 and M2 are in a high impedance state. Thus, potential of the wire 102 stays approximatively equal to the potential Vdd. Although not shown on FIG. 3, during the phase P2, the potential of the wire 102 may slightly decrease because of some current leaks.

For example, at the beginning of the phase P3, the secondary device S detects that the potential of the wire 102 corresponds to the potential Vdd, meaning that the transmitted bit is not a bit CTRL.

During the next phase P3, as the acknowledgment is granted, the potential GND is applied to port S2 and wire 102 by the secondary device S, while the port M2 is left in a high impedance state by the primary device M. Thus, the wire 102 is discharged to the potential GND.

During the next phase P4, the potential of the wire 102 stays equal to the potential GND as both ports S2 and M2 are in a high impedance state, indicating to the primary device M that the acknowledgment bit ACK is valid, or, said in other words, that the acknowledgment is granted. For example, the primary device M detects that the acknowledgment is granted based on the state of signal data-iM during the phase P4, for example based on the state of signal data-iM at the beginning of the phase P4.

Although not shown on FIG. 3, the illustrated phase P1 may immediately follow a phase P4 of a previous transmission of a bit between the devices S and M and/or the illustrated phase P4 may be immediately followed by the phase P1 of a next transmission of a bit between the devices S and M.

Although not illustrated by FIG. 9, in case the acknowledgment is not granted by the secondary device, or, said in other word, in case the secondary device S sends an invalid bit ACK, during phases P3 and P4, the secondary device S left is port S2 in a high impedance state, so that the potential of wire 102 stays approximatively equal to the potential Vdd. Such a bit transmission is, for example, illustrated by the chronogram of FIG. 4.

Although the FIG. 9 illustrates the transmission of a bit ACK from the secondary device S to the primary device M in the case where the acknowledgment is valid, FIG. 9 may also illustrate the transmission of a bit ACK from the primary device M to the secondary device S in the case where the acknowledgement is valid. Indeed, in phase P3 of the transmission of a valid bit ACK from the primary device M to the secondary device S, the potential GND is applied to port M2 and wire 102 by the primary device M, while the port S2 is in a high impedance state, and the wire 102 is discharged to the potential GND. Thus, in phase P3 of such a bit transmission, the wire 102 is discharged to reference potential GND as illustrated on FIG. 9. During the next phase P4, the potential of the wire 102 stays equal to the potential GND as both ports S2 and M2 are in a high impedance state, indicating to the secondary device S that the acknowledgment bit ACK is valid. For example, the secondary device S detects that the acknowledgment is granted based on the state of signal data-iS during the phase P4, for example based on the state of signal data-iS at the beginning of the phase P4.

Although not illustrated by FIG. 9, in case the acknowledgment sent by the primary device M to the secondary device S is not granted or, said in other word, in case the primary device M sends an invalid bit ACK, during the corresponding phases P3 and P4, the primary device M left is port S2 in a high impedance state, so that the potential of wire 102 stays approximatively equal to the potential Vdd. Such a bit transmission is, for example, illustrated by the chronogram of FIG. 4.

Figure 10A:
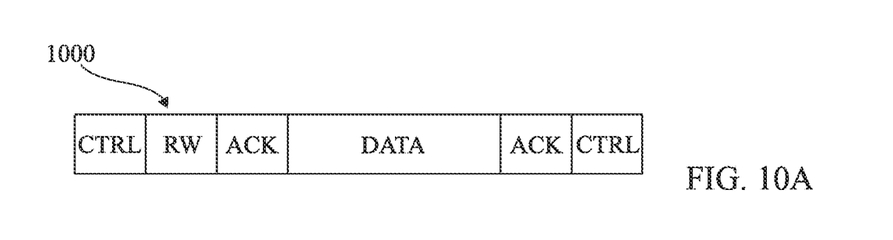
FIGS. 10A, 10B and 10C illustrate examples of packets exchanged in the system of FIG. 1 or 2.
Figure 10B:
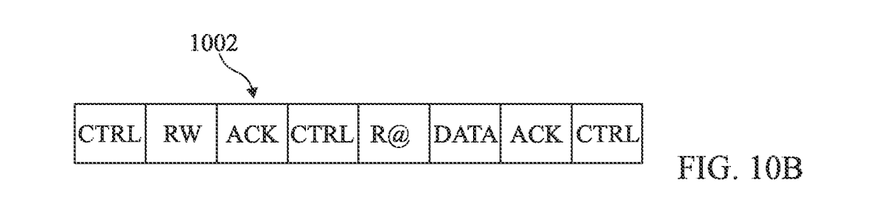
Figure 10C:
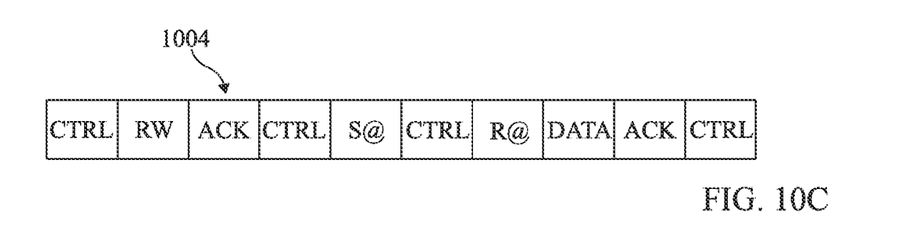

FIGS. 10A, 10B and 10C illustrate examples of packets of data that could be exchanged in the system 1 of FIG. 1 or 2.

FIG. 10A illustrates an example where the system 1 comprises only one secondary device S. Furthermore, in the example of FIG. 10A, when data are transmitted to the secondary device S or the primary device M, there is no need to indicate where the transmitted data have to be written in the secondary device S or where the transmitted data have to be read in the secondary device S.

In the example of FIG. 10A, the primary device M first sends a bit CTRL to the secondary device S, to indicate the beginning of a packet of data 1000.

A first bit of data RW is then sent by the primary device M to the secondary device S to indicate whether the data of the packet 1000 have to be read from the secondary device S or written into the secondary device S. For example, when the bit RW has the first value, the data of the packet 1000 are read from the device S, or, said in other words, are sent by the secondary device S to the primary device M, and, when the bit RW has the second value, the data of the packet 1000 are write into the device S, or, said in other words, are sent by the primary device M to the secondary device S. In another example, the first value, respectively the second value, of the bit RW indicates that the data of the packet 1000 are sent by the primary device M to the secondary device S, respectively by the secondary device S to the primary device M.

A bit of acknowledgement ACK is then sent by the secondary device S to the primary device M. For example, when bit ACK is valid, the primary device M knows that the secondary device S is ready to receive or send bits of data.

Then, the data of the packet 1000 (DATA on FIG. 10A) are sent by the secondary device S to the primary device M or by the primary device M to the secondary device S depending on the value of the bit RW. The data DATA are sent under the form of one bit of data or of a succession of a plurality of bits of data. The transmission of the data DATA of the packet 1000 is, for example, implemented only when the acknowledgment previously sent is valid.

Then, a bit of acknowledgment ACK is sent by the primary device M to the secondary device S when the data DATA have been sent by the secondary device S to the primary device S, or the bit of acknowledgment is sent by the secondary device S to the primary device M when the data DATA have been sent by the primary device M to the secondary device S. For example, a valid acknowledgment indicates that the data DATA were correctly received by the corresponding device S or M, and an invalid acknowledgment indicates that the data DATA were not correctly received by the corresponding device S or M.

Finally, the primary device M sends a bit CTRL to the secondary device S to indicate the end of the packet of data moo.

FIG. 10B illustrates an example where the system 1 comprises only one secondary device S. Furthermore, in the example of FIG. 10A, when data are transmitted to the secondary device S, there is need to indicate where the transmitted data have to be written in the secondary device S. FIG. 10B illustrates a data packet 1002.

The three first transmitted bits of the data packet 1002 are identical to the three first transmitted bits of the data packet 1002.

In the example of FIG. 10A it is considered that data of the packet 1002 are sent from the primary device M to the secondary device S. In this case, the third transmitted bit, that is, the acknowledgment bit ACK, is followed by a bit CTRL sent by the primary device M to the secondary device S, which indicates that the following transmitted bits of data corresponds to an address R@ where the data DATA of the packet 1002 have to be written in the secondary device S.

Then, the address R@ is transmitted via the bus ZPbus, under the form of one or a plurality of successive bits of data. The address R@ for example corresponds to an address or an index of a register of a plurality of registers of the secondary device S.

Then, the data of the packet 1002 (DATA on FIG. 10B) are sent by the primary device M to the secondary device S. The data DATA are sent under the form of one bit of data or of a succession of a plurality of bits of data.

Then, a bit of acknowledgment ACK is sent by the secondary device S to the primary device M. For example, a valid acknowledgment indicates that the data DATA were correctly received by the device S, and an invalid acknowledgment indicates that the data DATA were not correctly received by the device S.

Finally, the primary device M sends a bit CTRL to the secondary device S to indicate the end of the packet of data 1002.

FIG. 10C illustrates an example where the system 1 comprises a plurality of secondary devices S. For example, all the secondary devices are connected to the same wire boo and to the same wire 102.

Furthermore, in the example of FIG. 10C, when data are transmitted to a given secondary device S, there is need to indicate where the transmitted data have to be written in the secondary device S.

FIG. 10C illustrates a data packet 1004. The three first transmitted bits of the data packet 1004 are identical to the three first transmitted bits of the data packet 1002. For example, the third transmitted bit, that is the acknowledgment bit, indicates a valid acknowledgment if any one of the plurality of the secondary devices sends a valid acknowledgment.

In the example of FIG. 10C, it is considered that data of the packet 1004 are sent from the primary device M to one of secondary device S. In this case, following the transmission of the third bit ACK, the primary device M successively sends to the secondary device S a bit of control CTRL, an address S@ identifying to which of the secondary devices the primary device M sends data, a further bit of control CTRL, and an address R@ where the data DATA of the packet 1004 have to be written in the addressed secondary device S. The addresses S@ and R@ are each sent under the form of a plurality of successive bits of data. Thus, each secondary device connected to the primary device M that detects the succession of a bit CTRL, of a first plurality of bits of data, of a second bit CTRL and of a second plurality of bits of data knows that the first plurality of bits of data corresponds to the address S@ and that the second plurality of bits of data corresponds to the address R@.

Then, the data of the packet 1004 (DATA on FIG. 10C) are sent by the primary device M to the secondary device S. The data DATA are sent under the form of one bit of data or of a succession of a plurality of bits of data.

Then, a bit of acknowledgment ACK is sent by the secondary device S to the primary device M. For example, a valid acknowledgment indicates that the data DATA were correctly received by the device S, and an invalid acknowledgment indicates that the data DATA were not correctly received by the device S.

Finally, the primary device M sends a bit CTRL to the secondary device S to indicate the end of the packet of data 1004.

Those skilled in the art are capable, based on the description made in relation with FIGS. 1 to 9, to get the corresponding chronograms of the signal ZPclk and Zdtata corresponding to the data packets of the views A, B and C.

Other examples of data packets for transmitting data between the primary device M and at least one secondary device may be envisaged by those skilled in the art. These other data packets are, for example, each constructed by a given succession of transmitted bits of data, of acknowledgment ACK and of control CTRL between the devices.

Although in the examples above the first value, respectively the second value, of a bit of data corresponds to the binary value '0', respectively the binary value '1', the contrary is also possible.

Although in the examples above the potential Vdd is positive with respect to the reference potential, in other examples, the potential Vdd could be negative with respect to the reference potential.

Although in the examples above the active edges of the clock signal ZPclk are the rising edges, the contrary is also possible.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

What is claimed is:

1. A system comprising:
a primary device comprising:
a first port configured to be connected to a first port of a secondary device; and
a second port configured to be connected to a second port of the secondary device, wherein:
the first port of the primary device is configured to provide a clock signal determining, for each bit transmission between the primary device and the secondary device, a succession of a first phase, a second phase, a third phase and a fourth phase,
the primary device is configured to load its second port to a first potential different from a reference potential during a data bit transmission between the primary device and the secondary device,
the primary device is configured to put its second port in a high impedance state during the second and fourth phases of the data bit transmission between the primary device and the secondary device, and
the primary device is configured to put its second port in the high impedance state during the third phase of a data bit transmission from the secondary device to the primary device.

2. The system of claim 1, further comprising the secondary device including:
the first port connected to a first port of the primary device; and
the second port connected to a second port of the primary device, wherein:
the first port of the secondary device is configured to receive the clock signal from the primary device,
the secondary device is configured to put its second port in the high impedance state during the first, second and fourth phases of each bit transmission between the primary device and the secondary device, and
the secondary device is configured, during the third phase of the data bit transmission from the secondary device to the primary device, to discharge its second port to the reference potential when a value of the data bit transmission from the secondary device to the primary device has a first value and to leave its second port in the high impedance state when the value of the data bit transmission from the secondary device to the primary device has a second value.

3. The system of claim 2, wherein the primary device is configured, during the fourth phase of the data bit transmission from the secondary device to the primary device, to determine the value of the data bit transmission from the secondary device to the primary device based on a potential on its second port during the fourth phase.

4. The system of claim 2, wherein, during the third phase of a data transmission from the primary device to the secondary device:
the secondary device is configured to put its second port in the high impedance state; and
the primary device is configured to apply the reference potential on its second port when the value of the data bit transmission from the primary device to the secondary device is the first value and to put its second port in the high impedance state when the value of the data bit transmission from the primary device to the secondary device is the second value.

5. The system of claim 4, wherein, during the fourth phase of the data bit transmission from the primary device to the secondary device, the secondary device is configured to determine the value of the data bit transmission from the primary device to the secondary device based on a potential on its second port during the fourth phase.

6. The system of claim 2, wherein the primary device is configured to apply the reference potential to its second port during the first phase of a control bit transmission from the primary device to the secondary device.

7. The system of claim 6, wherein:
the secondary device is further configured to leave its second port in the high impedance state during the third and the fourth phase of the control bit transmission from the primary device to the secondary device, and
the primary device is further configured, during the second, third and fourth phases of the control bit transmission from the primary device to the secondary device, to leave its second port in the high impedance state or to discharge its second port to the reference potential.

8. The system of claim 2, wherein:
the primary device is configured to load its second port to the first potential during the first phase of an acknowledgment bit transmission from the secondary device to the primary device; and
the secondary device is configured, during the third phase of the acknowledgment bit transmission from the secondary device to the primary device, to discharge its second port to the reference potential when a value of the acknowledgment bit transmission from the secondary device to the primary device indicates a valid acknowledgment and to leave its second port in the high impedance state when the value of the acknowledgment bit transmission from the secondary device to the primary device indicates an invalid acknowledgement.

9. The system of claim 8, wherein the primary device is configured:
to leave its second port at the high impedance state during the second phase, the third phase and the fourth phase of the acknowledgment bit transmission from the secondary device to the primary device; and
during the fourth phase of the acknowledgment bit transmission from the secondary device to the primary device, to determine whether an acknowledgment represented by the value of the acknowledgment bit transmission from the secondary device to the primary device is valid based on a potential on its second port during the fourth phase.

10. The system of claim 2, wherein, at the beginning of the first phase, the second phase, the third phase and the fourth phase of each bit transmission between the primary device and the secondary device, the primary device is configured to provide an edge of a first type of the clock signal among a rising edge type and a falling edge type.

11. The system of claim 2, wherein the primary device is configured to provide only one pulse of the clock signal for each bit transmission between the primary device and the secondary device, the beginning of the pulse indicating the beginning of the third phase of each bit transmission between the primary device and the secondary device and the end of the pulse indicating the beginning of the fourth phase of each bit transmission between the primary device and the secondary device.

12. The system of claim 11, wherein a duration of each pulse of the clock signal is determined by a discharge time of the second ports of the devices from the first potential to the reference potential.

13. The system of claim 1, wherein the primary device is configured, during the fourth phase of the data bit transmission from the secondary device to the primary device, to determine a value of the data bit transmission from the secondary device to the primary device based on a potential on its second port during the fourth phase.

14. The system of claim 1, wherein the primary device is configured to apply the reference potential to its second port during the first phase of a control bit transmission from the primary device to the secondary device.

15. The system of claim 1, wherein the primary device is configured to load its second port to the first potential during the first phase of an acknowledgment bit transmission from the secondary device to the primary device.

16. A secondary device comprising:
   a first port configured to be connected to a first port of a primary device; and
   a second port configured to be connected to a second port of the primary device, wherein:
   the first port of the secondary device is configured to receive a clock signal determining, for each bit transmission between the primary device and the secondary device, a succession of a first phase, a second phase, a third phase and a fourth phase;
   the secondary device is configured to put its second port in a high impedance state during the first, second and fourth phases of each bit transmission between the primary device and the secondary device; and
   the secondary device is configured, during the third phase of a data bit transmission from the secondary device to the primary device, to discharge its second port to a reference potential when a value of the data bit transmission from the secondary device to the primary device has a first value and to leave its second port in the high impedance state when the value of the data bit transmission from the secondary device to the primary device has a second value.

17. The device of claim 16, wherein, during the third phase of a data bit transmission from the primary device to the secondary device, the secondary device is configured to put its second port in the high impedance state.

18. The device of claim 16, wherein the secondary device is configured, during the third phase of an acknowledgment bit transmission from the secondary device to the primary device, to discharge its second port to the reference potential when a value of the acknowledgment bit transmission from the secondary device to the primary device indicates a valid acknowledgment and to leave its second port in the high impedance state when the value of the acknowledgment bit transmission from the secondary device to the primary device indicates an invalid acknowledgement.

19. A method of transmitting a bit between a secondary device and a primary device, the secondary device comprising a first port connected to a first port of the primary device and a second port connected to a second port of the primary device, wherein:
   providing, by the primary device, a clock signal to the first port of the secondary device, the clock signal determining, for each bit transmission between the primary device and the secondary device, a succession of a first phase, a second phase, a third phase and a fourth phase;
   during the first phase of a data bit transmission between the primary device and the secondary device, loading the second port of the primary device to a first potential different from a reference potential;
   during the first phase of the data bit transmission between the primary device and the secondary device, leaving the second port of the secondary device in a high impedance state;
   during the second phase of the data bit transmission between the primary device and the secondary device, leaving the second port of the primary device in the high impedance state;
   during the third phase of a data bit transmission from the secondary device to the primary device, leaving the second port of the primary device in the high impedance state; and
   during the fourth phase of the data bit transmission between the primary device and the secondary device, determining a value for the data bit transmitted between the primary device and the secondary device based on a potential on the second port of the primary device and the second port of the secondary device.

20. The method of claim 19, further comprising:
   during the first phase of the data bit transmission between the primary device and the secondary device, leaving the second port of the secondary device in the high impedance state; and
   during the third phase of the data bit transmission from the secondary device to the primary device, discharging the second port of the secondary device to the reference potential to transmit a first value, and leaving the second port of the secondary device in the high impedance state to transmit a second value.

* * * * *